(12) United States Patent
Cho et al.

(10) Patent No.: US 10,431,693 B2
(45) Date of Patent: Oct. 1, 2019

(54) ARRAY SUBSTRATE AND DISPLAY PANEL

(71) Applicants: HKC Corporation Limited, Shenzhen (CN); Chongqing HKC Optoelectronics Technology Co., ltd., Chongqing (CN)

(72) Inventors: En-Tsung Cho, Chongqing (CN); Kun Fan, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

(*) Notice: Subject to any disclaimer, the term of this patent is extended or adjusted under 35 U.S.C. 154(b) by 0 days.

(21) Appl. No.: 15/869,825

(22) Filed: Jan. 12, 2018

(65) Prior Publication Data

US 2019/0013410 A1    Jan. 10, 2019

Related U.S. Application Data

(63) Continuation of application No. PCT/CN2017/096714, filed on Aug. 10, 2017.

(30) Foreign Application Priority Data

Jul. 6, 2017   (CN) .......................... 2017 1 0549910

(51) Int. Cl.
*H01L 29/786* (2006.01)
*H01L 27/12* (2006.01)
(Continued)

(52) U.S. Cl.
CPC ...... *H01L 29/78684* (2013.01); *H01L 27/124* (2013.01); *H01L 27/127* (2013.01);
(Continued)

(58) Field of Classification Search
CPC ... H01L 29/786–78696; H01L 23/4825; H01L 29/458; H01L 27/3248;
(Continued)

(56) References Cited

U.S. PATENT DOCUMENTS

| 8,569,172 | B1 * | 10/2013 | Jo | ....................... H01L 45/1253 |
| | | | | 438/686 |
| 9,349,866 | B2 * | 5/2016 | Ching | .................. H01L 29/785 |
| 9,666,719 | B2 * | 5/2017 | Yamazaki | ......... H01L 29/78618 |

* cited by examiner

*Primary Examiner* — Cuong B Nguyen
(74) *Attorney, Agent, or Firm* — WPAT, PC (57) ABSTRACT

The present application discloses an array substrate and a display panel, the display panel including: a substrate, a gate electrode, a gate insulating layer, a semiconductor layer, a source and a drain electrode, the gate electrode formed on an upper surface of the substrate; the gate insulating layer formed on upper surfaces of the gate electrode and the substrate to cover the gate electrode; the semiconductor layer formed on an upper surface of the gate insulating layer, and disposed above the gate electrode, the semiconductor layer including silicon germanium oxide, and the semiconductor layer including a channel portion; the source electrode formed on surfaces of the gate insulating layer and the semiconductor layer, and disposed on a side of the channel portion; and the drain electrode formed on the surfaces of the gate insulating layer and the semiconductor layer, and disposed on the other side of the channel portion.

20 Claims, 4 Drawing Sheets

(51) Int. Cl.
*H01L 29/49* (2006.01)
*G02F 1/1368* (2006.01)
*H01L 27/32* (2006.01)
(52) U.S. Cl.
CPC ...... *H01L 27/1222* (2013.01); *H01L 29/4908* (2013.01); *H01L 29/7869* (2013.01); *H01L 29/78618* (2013.01); *H01L 29/78696* (2013.01); *G02F 1/1368* (2013.01); *H01L 27/322* (2013.01); *H01L 27/3262* (2013.01)
(58) Field of Classification Search
CPC ..... H01L 27/127–1285; H01L 27/1296; H01L 27/3244–3279; H01L 2021/775; H01L 2029/42388
See application file for complete search history.

ARRAY SUBSTRATE AND DISPLAY PANEL

FIELD OF THE DISCLOSURE

The disclosure relates to a display technology field, and more particularly to an array substrate and a display panel.

BACKGROUND

The liquid crystal display with a compact body, power saving, no radiation and many other advantages, has been widely application. Most of the liquid crystal display in the market is a backlight type liquid crystal display, the backlight type liquid crystal display includes a liquid crystal panel and a backlight module. The working principle of the liquid crystal display is placing liquid crystal molecules in two parallel glass substrates, and applying driving voltage to control the direction of rotation of the molecule the liquid crystal between the two glass substrates to reflect the light from the backlight module to produce an image.

Wherein, thin film transistor-liquid crystal display (TFT-LCD) has gradually dominated the display field due to its low power consumption, excellent picture quality and high production yield. The similarly, the thin film transistor liquid crystal display includes a liquid crystal panel and a backlight module, and the liquid crystal panel includes a color filter substrate (CF substrate, also known as a color filter substrate) and a thin film transistor substrate (TFT substrate) and a transparent electrode is present on the inner side of the substrate. Between the two substrates, a layer of liquid crystal molecules (liquid crystal, LC). Liquid crystal panel is controlled by the electric field on the orientation of liquid crystal molecules, changing the polarization state of light, and through the polarizing plate to achieve the optical path of the penetration and blocking, to achieve the purpose of display.

The conventional TFT substrate is formed on a substrate with a semiconductor layer, typically an n-type semiconductor, such as amorphous silicon or polysilicon. Wherein, the electron mobility of polysilicon is higher than that of amorphous silicon. However, as the demand for the display panel increases, the electron mobility of the polysilicon can no longer show the demand for the device.

SUMMARY

The object of the present application to provide a display panel which is intended to provide a semiconductor layer that satisfies the demand of a display apparatus.

In order to solve the above-mentioned problems, an embodiment of the present application provides an array substrate, the display panel, including:

A substrate, including a plurality of switch assemblies; wherein each of the switch assembly includes:

A gate electrode formed on an upper surface of the substrate;

A gate insulating layer formed on upper surfaces of the gate electrode and the substrate to cover the gate electrode;

A semiconductor layer formed on an upper surface of the gate insulating layer, and disposed above the gate electrode, the semiconductor layer including silicon germanium oxide, and the semiconductor layer including a channel portion;

A source electrode formed on surfaces of the gate insulating layer and the semiconductor layer, and disposed on a side of the channel portion;

A drain electrode formed on the surfaces of the gate insulating layer and the semiconductor layer, and disposed on the other side of the channel portion;

Further, the semiconductor layer including a doped layer;

The doped layer disposed at a top of the semiconductor layer and divided into two portions by the channel portion, a portion adjacent to the drain electrode and a portion adjacent to the source electrode;

The active layer disposed at a bottom of the semiconductor layer, the doped layer disposed on an upper surface of the active layer;

Further, the doped layer includes a first doped layer and a second doped layer;

The second doped layer disposed at the top of the semiconductor layer, the first doped layer disposed at the bottom of the semiconductor layer, and between the second doped layer and the active layer;

A doping concentration of the second doped layer is greater than a doping concentration of the first doped layer.

Further, the display panel further including:

A protective layer formed on upper surfaces of the source electrode and the drain electrode to cover the source electrode and the drain electrode, and the protective layer disposed above the channel portion;

Further, the display panel further including:

A conductive layer formed on an upper surface of the protective layer, and divided by the channel portion.

Further, the conductive layer is an oxide conductor layer.

Further, the conductive layer is a metal layer.

Further, the substrate is a glass substrate.

Further, the gate insulating layer includes silicon nitride.

Further, the gate insulating layer includes an oxide insulating film.

The semiconductor layer of the TFT substrate is generally made of amorphous silicon or polycrystalline silicon, wherein the electron mobility of the amorphous silicon is 0.5 to 0.8, the electron mobility of the polysilicon is slightly higher than amorphous silicon, but the electron mobility is not high enough, and cannot meet the demand for a conventional display apparatus.

As another aspect of the present application, the present application also discloses a display panel, the display panel including the array substrate as described in the present application; the further including:

A plurality of pixel units disposed on a display region of an array substrate;

A control unit coupled to the pixel unit;

A color filter substrate disposed opposite to the array substrate;

Further, the array substrate further including:

A data line coupled to the plurality of pixel units to control the display gray scale of the pixel unit;

A scanning line coupled to the plurality of pixel units to control the pixel unit to turn on;

A data driving circuit coupled with the data line;

A scanning driving circuit coupled to the scanning line.

As another aspect of the present application, the present application also discloses a method for fabricating the display panel, the method including:

Forming a gate electrode on the substrate;

Forming a gate insulating layer and a semiconductor layer on the gate electrode;

Forming a source electrode and a drain electrode on the semiconductor layer;

The semiconductor layer is formed of a silicon germanium oxide.

The present application greatly improves the electron mobility of the active switch so as to satisfy the demand of the display device.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. For indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

An array substrate of the present application will be described in further detail below with reference to FIGS. 1-7 and the preferred embodiments.

The array substrate 100 in the embodiments below of the present application can be disposed in the display apparatus of the embodiment of the present application, that is, the display apparatus of the embodiment of the present application includes the array substrate 100 of any of the following embodiments. The display apparatus can be a liquid crystal display or an OLED (organic light-emitting diode) display. Wherein when the display apparatus of the embodiment of the present application is a liquid crystal display, the liquid crystal display includes a backlight module, the backlight module can be used as a light source for supplying a sufficient brightness and uniform distribution light source, the backlight module of the present embodiment can be a front light type, it can also be a back light type, it is to be noted that, the backlight module of the present embodiment is not limited thereto.

Following, the array substrate 100 is taken as an example for detail description, it is to be noted that, the following description of the array substrate 100 is also applicable to the display apparatus of the present embodiment.

Figure 1:
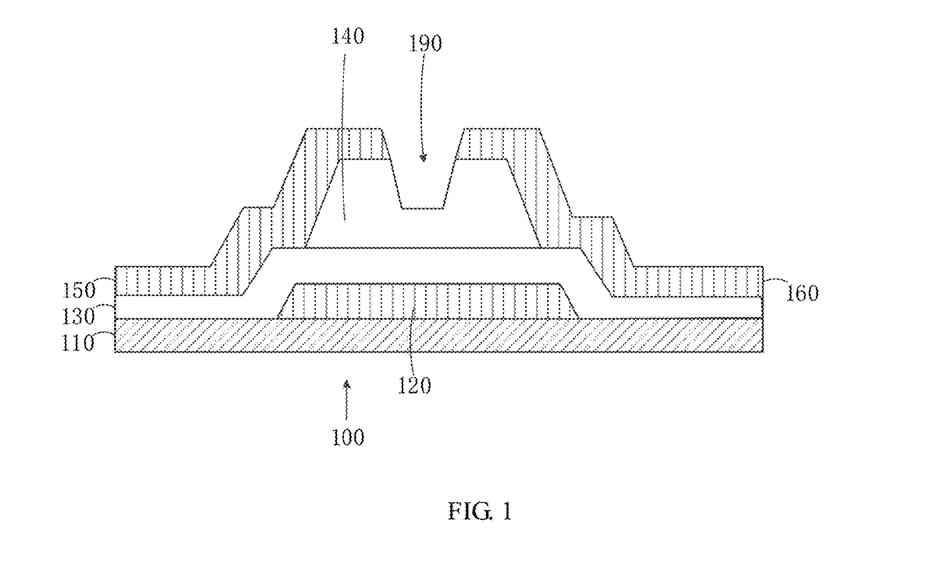
FIG. 1 is a schematic structural view of an array substrate of an embodiment of the present application.

As illustrated in FIG. 1, FIG. 1 is a schematic structural view of an array substrate according to an embodiment of the present application, wherein only a partial structure of the array substrate is shown in FIG. 1, the array substrate 100 of the embodiment of the present application includes a substrate 110, a gate electrode 120, a gate insulating layer 130, a semiconductor layer 140, a source electrode 150, and a drain electrode 160.

Wherein, the substrate 110 can include a glass plate having a good light transmittance, and is easily provided. It should be noted that, the substrate 110 of the present embodiment is not limited thereto, and can include other types, such as a flexible substrate.

Wherein, the gate electrode 120 is disposed on the upper surface of the substrate 110. Specifically, gate lines can be laid on the substrate 110 to form the gate electrode 120.

Wherein, the gate insulating layer 130 is formed on the upper surface of the gate electrode 120 and the substrate 110 to cover the gate electrode 120. The gate insulating layer 130 acts as an insulating function. The gate insulating layer 130 can be a silicon nitride film such as $SiN_x$, but an oxide insulating material can be used as the insulating film, that is, the oxide insulating material can be used as the gate insulating layer 130. In this case, the larger the dielectric constant of the oxide insulating film is, the more advantageous the operation of the thin film transistor. In addition, the greater the better insulation. It can be an oxide insulating film having a superlattice structure of an oxide. Further, an amorphous oxide insulating film can be used. In the case of an amorphous oxide insulating film, it is possible to maintain the film forming temperature at a low temperature, and therefore, it is advantageous in the case of a substrate such as a plastic substrate with poor in heat resistance.

For example, $ScAlMgO_4$, $ScAlZnO_4$, $ScAlCoO_4$, $ScAlMnO_4$, $ScGaZnO_4$, $ScGaMgO_4$, $ScAlZn_3O_6$, $ScAlZn_4O_7$, $ScAlZn_7O_{10}$, $ScGaZn_3O_6$, $ScGaZn_5O_8$, $ScGaZn_7O_{10}$, $ScFeZn_2O_5$, $ScFeZn_3O_6$, $ScFeZn_6O_9$ and the like can also be used.

In addition, an oxide such as alumina, titania, hafnium oxide, lanthanum oxide, and a composite oxide of a superlattice structure can be used.

Wherein the semiconductor layer 140 is formed on the upper surface of the gate insulating layer 130, and is disposed above the gate electrode 120, the semiconductor layer 140 is formed of silicon germanium oxide ($Si_xGe_yO_z$), and the semiconductor layer 140 is formed with a channel region 190.

The present application can improve the electron mobility of the array substrate, the electron mobility is the average drift velocity of the carriers generated at the unit electric field intensity. The electron mobility represents the ability of the carrier conductivity, electron mobility and the carrier (electron or hole) concentration determines the conductivity of the semiconductor. The electron mobility and the effective mass of the carrier are inversely proportional to the probability of scattering. The effective mass of the carrier is related to the material, and the electrons in the different semiconductors have different effective masses. The higher the electron mobility, the faster the device runs, and the higher the cutoff frequency to meet the needs of the display apparatus.

Figure 2:
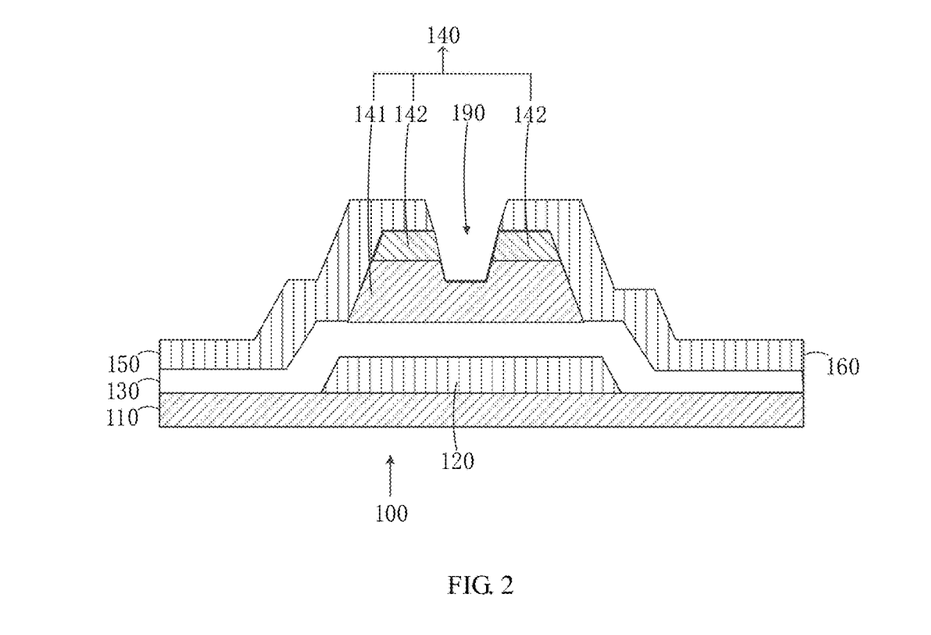
FIG. 2 is another schematic view of an array substrate of one embodiment of the present application.

Referring to FIG. 2, FIG. 2 is another schematic view of an array substrate according to an embodiment of the present application, wherein FIG. 2 shows only a partial structure of an array substrate. The array substrate of an embodiment of the present application includes a substrate 110, a gate electrode 120, a gate insulating layer 130, a semiconductor layer 140, a source electrode 150, and a drain electrode 160.

Wherein, the substrate 110 can include a glass plate having a good light transmittance, and is easily provided. It should be noted that, the substrate 110 of the present embodiment is not limited thereto, and can include other types, such as a flexible substrate.

Wherein, the gate electrode 120 is disposed on the upper surface of the substrate 110. Specifically, gate lines can be laid on the substrate 110 to form the gate electrode 120.

Wherein, the gate insulating layer 130 is formed on the upper surface of the gate electrode 120 and the substrate 110 to cover the gate electrode 120. The gate insulating layer 130 acts as an insulating function. The gate insulating layer 130 can be a silicon nitride film such as $SiN_x$, but an oxide insulating material can be used as the insulating film, that is, the oxide insulating material can be used as the gate insulating layer 130. In this case, the larger the dielectric constant of the oxide insulating film is, the more advantageous the operation of the thin film transistor. In addition, the greater the better insulation. It can be an oxide insulating film having a superlattice structure of an oxide. Further, an amorphous oxide insulating film can be used. In the case of an amorphous oxide insulating film, it is possible to maintain the film forming temperature at a low temperature, and therefore, it is advantageous in the case of a substrate such as a plastic substrate with poor in heat resistance. The specific components of the gate insulating layer can be referred to the above-described embodiment, and will not be described here.

The present application can increase the electron mobility of the active switch, the electron mobility is the average drift velocity of the carriers generated at the unit electric field intensity. The mobility represents the ability of the carrier conductivity, the mobility and the concentration of carriers (electrons or holes) determines the conductivity of the semiconductor. The electron mobility and the effective mass of the carrier are inversely proportional to the probability of scattering. The effective mass of the carrier is related to the material, and the electrons in the different semiconductors have different effective masses. For example, the effective mass of electrons in silicon is 0.5 m0 (m0 is the free electron mass), the effective mass of electrons in gallium arsenide is 0.07 m0. The holes are divided into weighted holes and light holes, the holes have different effective mass from electrons. The carriers in the semiconductor at low temperature are mainly scattered by the defects and impurities, and mainly scattered by phonons generated by the atomic lattice vibration at high temperature. The higher the mobility, the faster the device runs, and the higher the cutoff frequency. Therefore, the improvement of the present application can effectively improve the performance of the active switch.

The semiconductor layer 140 includes a doped layer 142 and an active layer 141, the doped layer 142 is disposed at the top of the semiconductor layer 140 and is separated by the channel portion 190 to form two portions, that is the portion adjacent to the drain electrode 160 and the portion adjacent to the source electrode 150; the active layer 141 is disposed at the bottom of the semiconductor layer 140, the doped layer 142 is disposed on the upper surface of the active layer 141.

Specifically, an n-type semiconductor can be doped in the doped layer 142, such as doping the polysilicon.

Wherein, the source electrode 150 is formed on the surface of the gate insulating layer 130 and the semiconductor layer 140, and is disposed on a side of the channel portion 190. Specifically, data lines can be laid on the gate insulating layer 130 to form the source electrode 150.

Wherein the drain electrode 160 is formed on the surface of the gate insulating layer 130 and the semiconductor layer 140, and is disposed on the other side of the channel portion 190. Specifically, data lines can be laid on the gate insulating layer 130 to form the drain electrode 160.

Figure 3:
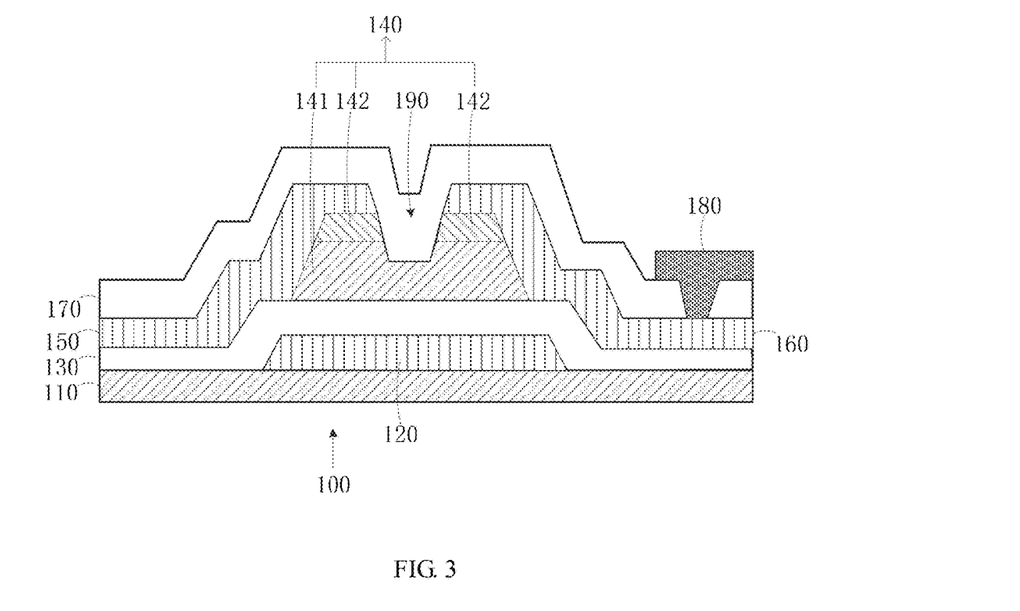
FIG. 3 is another schematic view of an array substrate of one embodiment of the present application.

As illustrated in FIG. 3, FIG. 3 is a schematic view showing another structure of an array substrate according to an embodiment of the present application, wherein FIG. 3 shows only a partial structure of an array substrate. The array substrate 100 of the embodiment of the present application includes a substrate 110, a gate electrode 120, a gate insulating layer 130, a semiconductor layer 140, a source electrode 150, and a drain electrode 160. The array substrate 100 further includes a protective layer 170 and a conductive layer 180, the protective layer 170 is formed on the upper surface of the source electrode 150 and the drain electrode 160 covering the source electrode 150 and the drain electrode 160, and the protective layer 170 is disposed above the channel portion 190. The protective layer 170 can be formed by the same material as the gate insulating layer.

The conductive layer 180 is formed on the upper surface of the protective layer 170, and is separated by the channel portion 190. The conductive layer 180 is an oxide conductor layer, or a metal layer.

The substrate 110 can include a glass plate having a good light transmittance, and is easily provided. It should be noted that, the substrate 110 of the present embodiment is not limited thereto, and can include other types, such as a flexible substrate.

The gate electrode 120 is disposed on the upper surface of the substrate 110. Specifically, gate lines can be laid on the substrate 110 to form the gate electrode 120.

The gate insulating layer 130 is formed on the upper surface of the gate electrode 120 and the substrate 110 to cover the gate electrode 120. The gate insulating layer 130 acts as an insulating function. The gate insulating layer 130 can be a silicon nitride film such as $SiN_x$, but an oxide insulating material can be used as the insulating film, that is, the oxide insulating material can be used as the gate insulating layer 130. In this case, the larger the dielectric constant of the oxide insulating film is, the more advantageous the operation of the thin film transistor. In addition, the greater the better insulation. It can be an oxide insulating film having a superlattice structure of an oxide. Further, an amorphous oxide insulating film can be used. In the case of an amorphous oxide insulating film, it is possible to maintain the film forming temperature at a low temperature, and therefore, it is advantageous in the case of a substrate such as a plastic substrate with poor in heat resistance. The specific components of the gate insulating layer can be referred to the above-described embodiment, and will not be described here.

The semiconductor layer 140 is formed on the upper surface of the gate insulating layer 130, and is positioned above the gate electrode 120. The semiconductor layer 140 is formed of a silicon germanium oxide ($Si_xGe_yO_z$), and the semiconductor layer 140 is formed with a channel portion 190.

The semiconductor layer 140 includes a doped layer 142 and an active layer 141, the doped layer 142 is disposed at the top of the semiconductor layer 140 and is separated by the channel portion 190 to form two portions, that is the portion adjacent to the drain electrode 160 and the portion adjacent to the source electrode 150; the active layer 141 is disposed at the bottom of the semiconductor layer 140, the doped layer 142 is disposed on the upper surface of the active layer 141.

Specifically, an n-type semiconductor can be doped in the doped layer 142, such as doping the polysilicon.

The source electrode 150 is formed on the surface of the gate insulating layer 130 and the semiconductor layer 140, and is disposed on a side of the channel portion 190. Specifically, data lines can be laid on the gate insulating layer 130 to form the source electrode 150.

The drain electrode 160 is formed on the surface of the gate insulating layer 130 and the semiconductor layer 140, and is disposed on the other side of the channel portion 190. Specifically, data lines can be laid on the gate insulating layer 130 to form the drain electrode 160.

Figure 4:
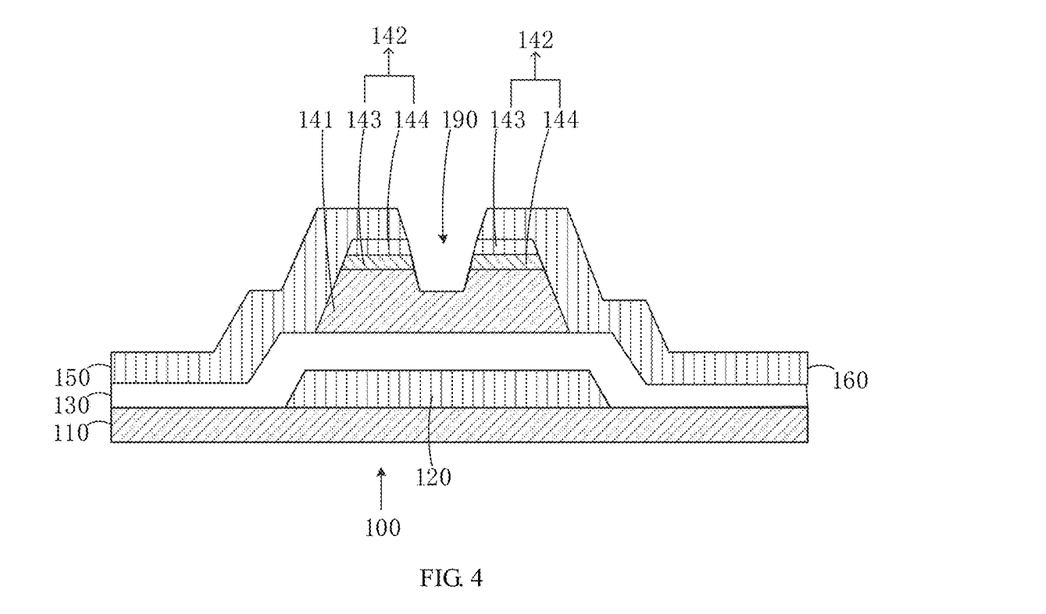
FIG. 4 is another schematic view of an array substrate of one embodiment of the present application.

As shown in FIG. 4, FIG. 4 is another schematic view of an array substrate of an embodiment of the present application, FIG. 4 shows only a partial structure of an array substrate. The array substrate 100 of an embodiment of the present application includes a substrate 110, a gate electrode 120, a gate insulating layer 130, a semiconductor layer 140, a source electrode 150, and a drain electrode 160.

Wherein, the substrate 110 can include a glass plate having a good light transmittance, and is easily provided. It should be noted that, the substrate 110 of the present embodiment is not limited thereto, and can include other types, such as a flexible substrate.

Wherein, the gate electrode 120 is disposed on the upper surface of the substrate 110. Specifically, gate lines can be laid on the substrate 110 to form the gate electrode 120.

The semiconductor layer 140 includes a doped layer 142 and an active layer 141; the doped layer 142 is disposed at the top of the semiconductor layer 140 and is separated by the channel portion 190 to form two portions, that is the portion adjacent to the drain electrode 160 and the portion adjacent to the source electrode 150; the active layer 141 is disposed at the bottom of the semiconductor layer 140, the doped layer 142 is disposed on the upper surface of the active layer 141.

Specifically, an n-type semiconductor can be doped in the doped layer 142, such as doping the polysilicon.

More specifically, the doped layer 142 includes a first doped layer 143 and a second doped layer 144; the second doped layer 144 is disposed at the top of the semiconductor layer 140, and the first doped layer 143 is disposed at the bottom of the semiconductor layer 140, and the first doped layer 143 is disposed between the second doped layer 144 and the active layer 141; the doping concentration of the second doped layer 144 is greater than the doping concentration of the first doped layer 143.

Wherein, the source electrode 150 is formed on the surface of the gate insulating layer 130 and the semiconductor layer 140, and is disposed on the one side of the channel portion 190. Specifically, data lines can be laid on the substrate 110 to form the source electrode 150.

Wherein the drain electrode 160 is formed on the surface of the gate insulating layer 130 and the semiconductor layer 140, and is disposed on the other side of the channel portion 190. Specifically, data lines can be laid on the substrate 110 to form the drain electrode 160.

Figure 5:
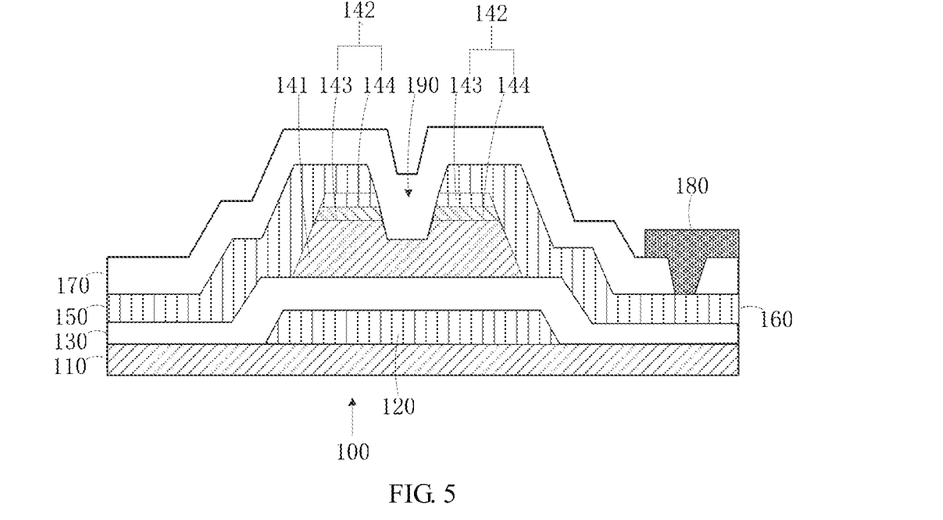
FIG. 5 is another schematic view of an array substrate of one embodiment of the present application.

As illustrated in FIG. 5, FIG. 5 is a schematic view showing another structure of an array substrate according to an embodiment of the present application, FIG. 5 shows only a partial structure of an array substrate. The array substrate 100 of an embodiment of the present application includes a substrate 110, a gate electrode 120, a gate insulating layer 130, a semiconductor layer 140, a source electrode 150, and a drain electrode 160.

Wherein, the substrate 110 can include a glass plate having a good light transmittance, and is easily provided. It should be noted that, the substrate 110 of the present embodiment is not limited thereto, and can include other types, such as a flexible substrate.

Wherein, the gate electrode 120 is disposed on the upper surface of the substrate 110. Specifically, gate lines can be laid on the substrate 110 to form the gate electrode 120.

Wherein, the gate insulating layer 130 is formed on the upper surface of the gate electrode 120 and the substrate 110 to cover the gate electrode 120. The gate insulating layer 130 acts as an insulating function. The gate insulating layer 130 can be a silicon nitride film such as $SiN_x$, but an oxide insulating material can be used as the insulating film, that is, the oxide insulating material can be used as the gate insulating layer 130. In this case, the larger the dielectric constant of the oxide insulating film is, the more advantageous the operation of the thin film transistor. In addition, the greater the better insulation. It can be an oxide insulating film having a superlattice structure of an oxide. Further, an amorphous oxide insulating film can be used. In the case of an amorphous oxide insulating film, it is possible to maintain the film forming temperature at a low temperature, and therefore, it is advantageous in the case of a substrate such as a plastic substrate with poor in heat resistance. The specific components of the gate insulating layer can be referred to the above-described embodiment, and will not be described here.

The semiconductor layer 140 includes a doped layer 142 and an active layer 141, the doped layer 142 is disposed at the top of the semiconductor layer 140, and is separated by the channel portion 190 to form two portions, that is the portion adjacent to the drain electrode 160 and the portion adjacent to the source electrode 150; the active layer 141 is disposed at the bottom of the semiconductor layer 140, the doped layer 142 is disposed on the upper surface of the active layer 141.

Specifically, an n-type semiconductor can be doped in the doped layer 142, such as doping the polysilicon.

More specifically, the doped layer 142 includes a first doped layer 143 and a second doped layer 144; the second doped layer 144 is disposed at the top of the semiconductor layer 140, and the first doped layer 143 is disposed at the bottom of the semiconductor layer 140, and the first doped layer 143 is disposed between the second doped layer 144 and the active layer 141; the doping concentration of the second doped layer 144 is greater than the doping concentration of the first doped layer 143.

Wherein, the source electrode 150 is formed on the surface of the gate insulating layer 130 and the semiconductor layer 140, and is disposed on a side of the channel portion 190. Specifically, data lines can be laid on the gate insulating layer 130 to form the source electrode 150.

Wherein, the drain electrode 160 is formed on the surface of the gate insulating layer 130 and the semiconductor layer 140, and is disposed on the other side of the channel portion 190. Specifically, data lines can be laid on the gate insulating layer 130 to form the drain electrode 160.

The array substrate 100 further includes a protective layer 170, the protective layer 170 is formed on the upper surface of the source electrode 150 and the drain electrode 160 and covering the source electrode 150 and the drain electrode 160, and the protective layer 170 is disposed above the channel portion 190.

Wherein, the protective layer 170 can use the same material as the gate insulating layer.

The array substrate further includes a conductive layer 180, the conductive layer 180 is formed on the upper surface of the protective layer 170, and is separated by the channel portion 190. The conductive layer 180 is an oxide conductor layer, or a metal layer.

Figure 6:
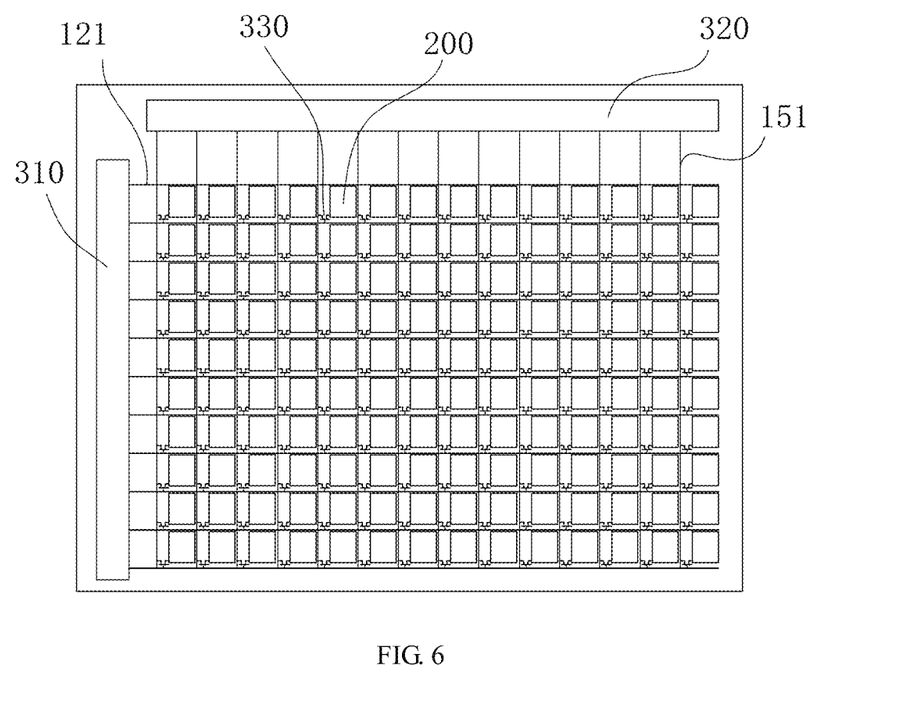
FIG. 6 is another schematic view of a display panel of one embodiment of the present application.
Figure 7:
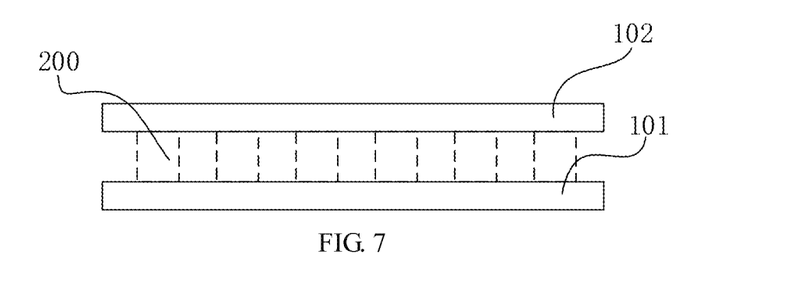
FIG. 7 is a schematic cross-sectional view of a display panel of an embodiment of the present application.

Referring to FIGS. 6 and 7, the present embodiment also discloses a display panel, the display panel includes a plurality of pixel units 200, the plurality of pixel units 200 is provided corresponding to a display region of the array substrate 101; a control unit coupled to the pixel unit 200, and a color filter substrate 102 disposed parallel and opposite to the array substrate. Scanning lines 121 and data lines 151 are crisscrossed in vertical and horizontal and disposed in the display region of the array substrate to form plurality of rectangular squares, each of the rectangular square corresponds to one of the pixel unit 200. The control unit includes a scanning driving circuit 310 for driving the scanning lines, and a data driving circuit 320 for driving the data lines, and a switch assembly 330 for controlling the pixel unit 200.

Figure 8:
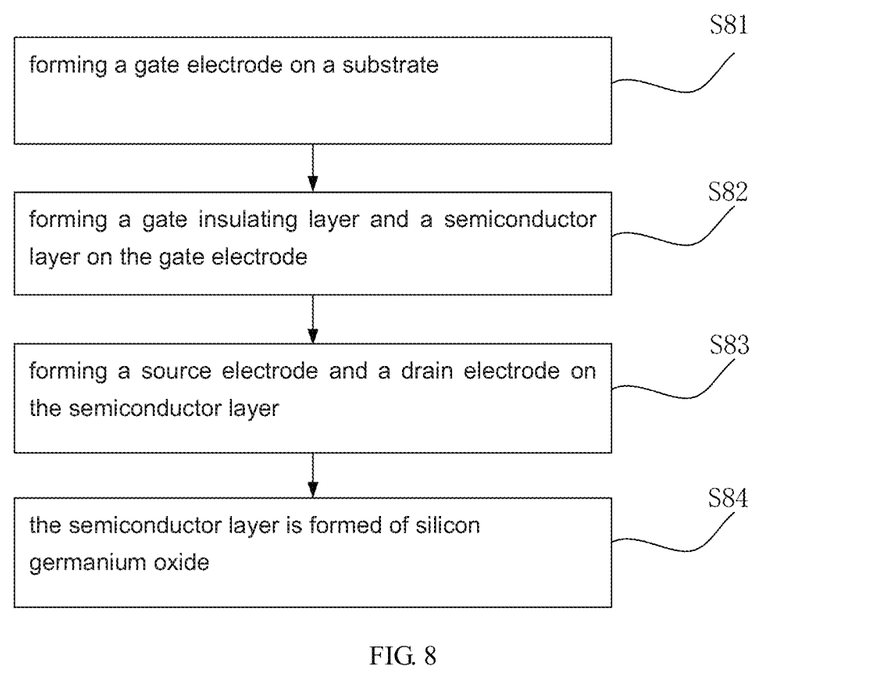
FIG. 8 is a schematic view of a method for fabricating a display panel according to an embodiment of the present application.

Referring to FIG. 8, the present embodiment also discloses a method for fabricating the display panel of the present application, method for fabricating the display panel includes:

s81, forming a gate electrode on a substrate;

s82, forming a gate insulating layer and a semiconductor layer on the gate electrode;

s83, forming a source electrode and a drain electrode on the semiconductor layer;

s84, the semiconductor layer is formed of silicon germanium oxide.

Referring to FIG. 5, the substrate 110 can include a glass plate having a good light transmittance, and is easily provided. It should be noted that, the substrate 110 of the present embodiment is not limited thereto, and can include other types, such as a flexible substrate.

Wherein, the gate electrode 120 is disposed on the upper surface of the substrate 110. Specifically, gate lines can be laid on the substrate 110 to form the gate electrode 120.

Wherein, the gate insulating layer 130 is formed on the upper surface of the gate electrode 120 and the substrate 110 to cover the gate electrode 120. The gate insulating layer 130 acts as an insulating function. The gate insulating layer 130 can be a silicon nitride film such as $SiN_x$, but an oxide insulating material can be used as the insulating film, that is, the oxide insulating material can be used as the gate insulating layer 130. In this case, the larger the dielectric constant of the oxide insulating film is, the more advantageous the operation of the thin film transistor. In addition, the greater the better insulation. It can be an oxide insulating film having a superlattice structure of an oxide. Further, an amorphous oxide insulating film can be used. In the case of an amorphous oxide insulating film, it is possible to maintain the film forming temperature at a low temperature, and therefore, it is advantageous in the case of a substrate such as a plastic substrate with poor in heat resistance. The specific components of the gate insulating layer can be referred to the above-described embodiment, and will not be described here.

The semiconductor layer 140 includes a doped layer 142 and an active layer 141, the doped layer 142 is disposed at the top of the semiconductor layer 140, and is separated by the channel portion 190 to form two portions, that is the portion adjacent to the drain electrode 160 and the portion adjacent to the source electrode 150; the active layer 141 is disposed at the bottom of the semiconductor layer 140, the doped layer 142 is disposed on the upper surface of the active layer 141.

Specifically, an n-type semiconductor can be doped in the doped layer 142, such as doping the polysilicon.

More specifically, the doped layer 142 includes a first doped layer 143 and a second doped layer 144; the second doped layer 144 is disposed at the top of the semiconductor layer 140, and the first doped layer 143 is disposed at the bottom of the semiconductor layer 140, and the first doped layer 143 is disposed between the second doped layer 144 and the active layer 141; the doping concentration of the second doped layer 144 is greater than the doping concentration of the first doped layer 143.

Wherein, the source electrode 150 is formed on the surface of the gate insulating layer 130 and the semiconductor layer 140, and is disposed on a side of the channel portion 190. Specifically, data lines can be laid on the gate insulating layer 130 to form the source electrode 150.

Wherein, the drain electrode 160 is formed on the surface of the gate insulating layer 130 and the semiconductor layer 140, and is disposed on the other side of the channel portion 190. Specifically, data lines can be laid on the gate insulating layer 130 to form the drain electrode 160.

The array substrate 100 further includes a protective layer 170, the protective layer 170 is formed on the upper surface of the source electrode 150 and the drain electrode 160 and covering the source electrode 150 and the drain electrode 160, and the protective layer 170 is disposed above the channel portion 190.

Wherein, the protective layer 170 can use the same material as the gate insulating layer.

The array substrate further includes a conductive layer 180, the conductive layer 180 is formed on the upper surface of the protective layer 170, and is separated by the channel portion 190. The conductive layer 180 is an oxide conductor layer, or a metal layer.

The display panel can be, for example, an LCD display panel, an OLED display panel, a QLED display panel, a surface display panel, or other display panel.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. An array substrate, comprising:
a substrate comprising a plurality of switch assemblies; wherein each of the switch assembly comprises:
a gate electrode is formed on an upper surface of the substrate;
a gate insulating layer is formed on upper surfaces of the gate electrode and the substrate to cover the gate electrode;
a semiconductor layer is formed on an upper surface of the gate insulating layer, and is disposed above the gate electrode, wherein the semiconductor layer is formed of silicon germanium oxide, and the semiconductor layer comprises a channel portion;
a source electrode is formed on surfaces of the gate insulating layer and the semiconductor layer, and is disposed on a side of the channel portion;
a drain electrode formed is on the surfaces of the gate insulating layer and the semiconductor layer, and is disposed on the other side of the channel portion;
a protective layer is formed on upper surfaces of the source electrode and the drain electrode to cover the source electrode and the drain electrode, and the protective layer is disposed above the channel portion;
a conductive layer is formed on an upper surface of the protective layer; and
wherein the semiconductor layer comprises a doped layer and an active layer; the doped layer is disposed at a top of the semiconductor layer and is divided into two portions by the channel portion, one of the portion is adjacent to the drain electrode and the other portion is adjacent to the source electrode; the active layer is disposed at a bottom of the semiconductor layer, the doped layer is disposed on an upper surface of the active layer; the doped layer comprises a first doped layer and a second doped layer; the second doped layer is disposed at the top of the semiconductor layer, the first doped layer is disposed at the bottom of the semiconductor layer, and is between the second doped layer and the active layer; a doping concentration of the second doped layer is greater than a doping concentration of the first doped layer.

2. An array substrate, comprising:
a substrate comprising a plurality of switch assemblies; wherein each of the switch assembly comprises:
a gate electrode is formed on an upper surface of the substrate;
a gate insulating layer is formed on upper surfaces of the gate electrode and the substrate to cover the gate electrode;
a semiconductor layer is formed on an upper surface of the gate insulating layer, and is disposed above the gate electrode, the semiconductor layer is formed of silicon germanium oxide, and the semiconductor layer comprises a channel portion;
a source electrode is formed on surfaces of the gate insulating layer and the semiconductor layer, and is disposed on a side of the channel portion; and
a drain electrode is formed on the surfaces of the gate insulating layer and the semiconductor layer, and is disposed on the other side of the channel portion.

3. The array substrate according to claim 2, wherein the semiconductor layer comprises a doped layer and an active layer;
the doped layer is disposed at a top of the semiconductor layer and is divided into two portions by the channel portion, one of the portion is adjacent to the drain electrode and the other portion is adjacent to the source electrode; and
the active layer is disposed at a bottom of the semiconductor layer, the doped layer is disposed on an upper surface of the active layer.

4. The array substrate according to claim 3, wherein the doped layer comprises a first doped layer and a second doped layer;
the second doped layer is disposed at the top of the semiconductor layer, the first doped layer is disposed at the bottom of the semiconductor layer, and is between the second doped layer and the active layer; and
a doping concentration of the second doped layer is greater than a doping concentration of the first doped layer.

5. The array substrate according to claim 2, wherein the semiconductor layer comprises a doped layer and an active layer;
the doped layer is disposed at a top of the semiconductor layer and is divided into two portions by the channel portion, one of the portion is adjacent to the drain electrode and the other portion is adjacent to the source electrode;
the active layer is disposed at a bottom of the semiconductor layer, the doped layer is disposed on an upper surface of the active layer;
the doped layer comprises a first doped layer and a second doped layer;
the second doped layer is disposed at the top of the semiconductor layer, the first doped layer is disposed at the bottom of the semiconductor layer, and is between the second doped layer and the active layer; and
a doping concentration of the second doped layer is greater than a doping concentration of the first doped layer.

6. The array substrate according to claim 2, wherein the array substrate further comprises:
a protective layer is formed on upper surfaces of the source electrode and the drain electrode to cover the source electrode and the drain electrode, and the protective layer is disposed above the channel portion; and
a conductive layer is formed on an upper surface of the protective layer, and is divided by the channel portion.

7. The array substrate according to claim 6, wherein the conductive layer is an oxide conductor layer.

8. The array substrate according to claim 2, wherein the array substrate further comprises:
- a protective layer is formed on upper surfaces of the source electrode and the drain electrode to cover the source electrode and the drain electrode, and the protective layer is disposed above the channel portion;
- a conductive layer is formed on an upper surface of the protective layer, and is divided by the channel portion; and
- the conductive layer is an oxide conductor layer.

9. The array substrate according to claim 2, wherein the semiconductor layer comprises a doped layer and an active layer;
- the doped layer is disposed at a top of the semiconductor layer and is divided into two portions by the channel portion, one of the portion is adjacent to the drain electrode and the other portion is adjacent to the source electrode;
- the active layer is disposed at a bottom of the semiconductor layer, the doped layer is disposed on an upper surface of the active layer;
- the doped layer comprises a first doped layer and a second doped layer;
- the second doped layer is disposed at the top of the semiconductor layer, the first doped layer disposed at the bottom of the semiconductor layer, and is between the second doped layer and the active layer;
- a doping concentration of the second doped layer is greater than a doping concentration of the first doped layer; and
- wherein the array substrate further comprises: a protective layer is formed on upper surfaces of the source electrode and the drain electrode to cover the source electrode and the drain electrode, and the protective layer is disposed above the channel portion; a conductive layer is formed on an upper surface of the protective layer; the conductive layer is an oxide conductor layer.

10. The array substrate according to claim 6, wherein the conductive layer is a metal layer.

11. The array substrate according to claim 2, wherein the array substrate further comprises:
- a protective layer is formed on upper surfaces of the source electrode and the drain electrode to cover the source electrode and the drain electrode, and the protective layer is disposed above the channel portion;
- a conductive layer is formed on an upper surface of the protective layer; and
- the conductive layer is a metal layer.

12. The array substrate according to claim 2, wherein the semiconductor layer comprises a doped layer and an active layer;
- the doped layer is disposed at a top of the semiconductor layer and is divided into two portions by the channel portion, one of the portion is adjacent to the drain electrode and the other portion is adjacent to the source electrode;
- the active layer is disposed at a bottom of the semiconductor layer, the doped layer is disposed on an upper surface of the active layer;
- the doped layer comprises a first doped layer and a second doped layer;
- the second doped layer is disposed at the top of the semiconductor layer, the first doped layer is disposed at the bottom of the semiconductor layer, and is between the second doped layer and the active layer;
- a doping concentration of the second doped layer is greater than a doping concentration of the first doped layer; and
- wherein the array substrate further comprises: a protective layer is formed on upper surfaces of the source electrode and the drain electrode to cover the source electrode and the drain electrode, and the protective layer is disposed above the channel portion; a conductive layer is formed on an upper surface of the protective layer; the conductive layer is a metal layer.

13. The array substrate according to claim 2, wherein the gate insulating layer is formed of silicon nitride.

14. The array substrate according to claim 2, wherein the semiconductor layer comprises a doped layer and an active layer;
- the doped layer is disposed at a top of the semiconductor layer and is divided into two portions by the channel portion, one of the portion is adjacent to the drain electrode and the other portion is adjacent to the source electrode;
- the active layer is disposed at a bottom of the semiconductor layer, the doped layer is disposed on an upper surface of the active layer;
- the doped layer comprises a first doped layer and a second doped layer;
- the second doped layer is disposed at the top of the semiconductor layer, the first doped layer is disposed at the bottom of the semiconductor layer, and is between the second doped layer and the active layer;
- a doping concentration of the second doped layer is greater than a doping concentration of the first doped layer;
- wherein the array substrate further comprises: a protective layer is formed on upper surfaces of the source electrode and the drain electrode to cover the source electrode and the drain electrode, and the protective layer is disposed above the channel portion; a conductive layer is formed on an upper surface of the protective layer; the conductive layer is a metal layer; and
- the gate insulating layer is formed of silicon nitride.

15. The array substrate according to claim 2, wherein the gate insulating layer is formed of an oxide insulating film.

16. The array substrate according to claim 2, wherein the semiconductor layer comprises a doped layer and an active layer;
- the doped layer is disposed at a top of the semiconductor layer and is divided into two portions by the channel portion, one of the portion is adjacent to the drain electrode and the other portion is adjacent to the source electrode;
- the active layer is disposed at a bottom of the semiconductor layer, the doped layer is disposed on an upper surface of the active layer;
- the doped layer comprises a first doped layer and a second doped layer;
- the second doped layer is disposed at the top of the semiconductor layer, the first doped layer is disposed at the bottom of the semiconductor layer, and is between the second doped layer and the active layer;
- a doping concentration of the second doped layer is greater than a doping concentration of the first doped layer;
- wherein the array substrate further comprises: a protective layer is formed on upper surfaces of the source electrode and the drain electrode to cover the source electrode and the drain electrode, and the protective layer is disposed above the channel portion; a conductive layer is formed on an upper surface of the protective layer; the conductive layer is a metal layer; and the gate insulating layer is formed of oxide insulating film.

17. The array substrate according to claim 2, wherein the semiconductor layer comprises a doped layer and an active layer;
- the doped layer is disposed at a top of the semiconductor layer and is divided into two portions by the channel portion, one of the portion is adjacent to the drain electrode and the other portion is adjacent to the source electrode;
- the active layer is disposed at a bottom of the semiconductor layer, the doped layer is disposed on an upper surface of the active layer;
- the doped layer comprises a first doped layer and a second doped layer;
- the second doped layer is disposed at the top of the semiconductor layer, the first doped layer is disposed at the bottom of the semiconductor layer, and is between the second doped layer and the active layer;
- a doping concentration of the second doped layer is greater than a doping concentration of the first doped layer;
- wherein the array substrate further comprises: a protective layer is formed on upper surfaces of the source electrode and the drain electrode to cover the source electrode and the drain electrode, and the protective layer is disposed above the channel portion; a conductive layer is formed on an upper surface of the protective layer; the conductive layer is a metal layer; and
- the gate insulating layer is formed of silicon nitride or the gate insulating layer is formed of oxide insulating film.

18. A display panel, comprising:
a plurality of pixel units disposed on a display region of an array substrate;
a control unit coupled to the pixel unit;
a color filter substrate disposed opposite to the array substrate;
an array substrate, comprising:
a substrate comprising a plurality of switch assemblies; wherein each of the switch assembly comprises:
a gate electrode is formed on an upper surface of the substrate;
a gate insulating layer is formed on upper surfaces of the gate electrode and the substrate to cover the gate electrode;
a semiconductor layer is formed on an upper surface of the gate insulating layer, and is disposed above the gate electrode, the semiconductor layer is formed of silicon germanium oxide, and the semiconductor layer comprising a channel portion;
a source electrode is formed on surfaces of the gate insulating layer and the semiconductor layer, and is disposed on a side of the channel portion; and
a drain electrode is formed on the surfaces of the gate insulating layer and the semiconductor layer, and is disposed on the other side of the channel portion.

19. The display panel according to claim 18, wherein the semiconductor layer comprises a doped layer and an active layer;
- the doped layer is disposed at a top of the semiconductor layer and is divided into two portions by the channel portion, one of the portion is adjacent to the drain electrode and the other portion is adjacent to the source electrode;
- the active layer is disposed at a bottom of the semiconductor layer, the doped layer is disposed on an upper surface of the active layer;
- the doped layer comprises a first doped layer and a second doped layer;
- the second doped layer is disposed at the top of the semiconductor layer, the first doped layer is disposed at the bottom of the semiconductor layer, and is between the second doped layer and the active layer; and
- a doping concentration of the second doped layer is greater than a doping concentration of the first doped layer.

20. The display panel according to claim 18, wherein the semiconductor layer comprises a doped layer and an active layer;
- the doped layer is disposed at a top of the semiconductor layer and is divided into two portions by the channel portion, one of the portion is adjacent to the drain electrode and the other portion is adjacent to the source electrode;
- the active layer is disposed at a bottom of the semiconductor layer, the doped layer is disposed on an upper surface of the active layer;
- the doped layer comprises a first doped layer and a second doped layer;
- the second doped layer is disposed at the top of the semiconductor layer, the first doped layer is disposed at the bottom of the semiconductor layer, and is between the second doped layer and the active layer;
- a doping concentration of the second doped layer is greater than a doping concentration of the first doped layer;
- wherein the array substrate further comprises: a protective layer is formed on upper surfaces of the source electrode and the drain electrode to cover the source electrode and the drain electrode, and the protective layer is disposed above the channel portion; a conductive layer is formed on an upper surface of the protective layer; the conductive layer is a metal layer; and
- the gate insulating layer is formed of silicon nitride or the gate insulating layer is formed of oxide insulating film.

* * * * *